(12) United States Patent
Shimada et al.

(10) Patent No.: US 7,257,956 B2
(45) Date of Patent: Aug. 21, 2007

(54) COOLING APPARATUS

(75) Inventors: Tetsuya Shimada, Osaka (JP);
Katsuhiko Watabe, Osaka (JP)

(73) Assignee: ESPEC Corp., Osaka (JP)

( * ) Notice: Subject to any disclaimer, the term of this patent is extended or adjusted under 35 U.S.C. 154(b) by 197 days.

(21) Appl. No.: 11/195,500

(22) Filed: Aug. 1, 2005

(65) Prior Publication Data

US 2006/0021364 A1 Feb. 2, 2006

(30) Foreign Application Priority Data

Jul. 30, 2004 (JP) ............................ 2004-224857

(51) Int. Cl.
*F28B 9/00* (2006.01)
(52) U.S. Cl. ......................................... 62/172; 62/401
(58) Field of Classification Search ................... 62/121, 62/171, 172, 176.4, 304, 401, 259.2, 404; 261/DIG. 3, 157; 361/690, 691
See application file for complete search history.

(56) References Cited

U.S. PATENT DOCUMENTS

| | | | |
|---|---|---|---|
| 4,851,965 A | 7/1989 | Gabuzda et al. | |
| 5,640,046 A * | 6/1997 | Suzuki et al. | 257/714 |
| 5,733,177 A * | 3/1998 | Tsuchiya et al. | 451/41 |
| 6,279,650 B1 * | 8/2001 | Sung | 165/222 |
| 6,386,957 B1 * | 5/2002 | Masumura et al. | 451/59 |
| 6,684,942 B2 * | 2/2004 | Song et al. | 165/122 |
| 6,722,151 B2 * | 4/2004 | Spinazzola et al. | 62/259.2 |
| 6,745,579 B2 * | 6/2004 | Spinazzola et al. | 62/89 |
| 6,859,366 B2 * | 2/2005 | Fink | 361/690 |
| 7,011,576 B2 * | 3/2006 | Sharp et al. | 454/184 |
| 2002/0160697 A1 * | 10/2002 | Okamura et al. | 451/53 |
| 2005/0175775 A1 * | 8/2005 | Shirley | 427/240 |

FOREIGN PATENT DOCUMENTS

| | | |
|---|---|---|
| JP | 2000-28896 | 1/1989 |
| JP | 4-321113 | 11/1992 |
| JP | 6-307731 A * | 11/1994 |
| JP | 8-211122 | 8/1996 |
| JP | 11-231943 | 8/1999 |

* cited by examiner

*Primary Examiner*—Mohammad M. Ali
(74) *Attorney, Agent, or Firm*—Jordan and Hamburg LLP

(57) ABSTRACT

A cooling apparatus configured such that a cooling body provided with heat-dissipating plates is pressed against a device to which a socket of a burn-in board is attached, and air is provided by a blower such that the air passes between the heat-dissipating plates, and compressed air provided from a compressed air supply system is discharged by a nozzle so that it directly hits a portion of the cooling upper surface of the cooling body. By means of the cooling effects from these two types of air, a device generating a large amount of heat can be cooled with good temperature accuracy.

4 Claims, 6 Drawing Sheets

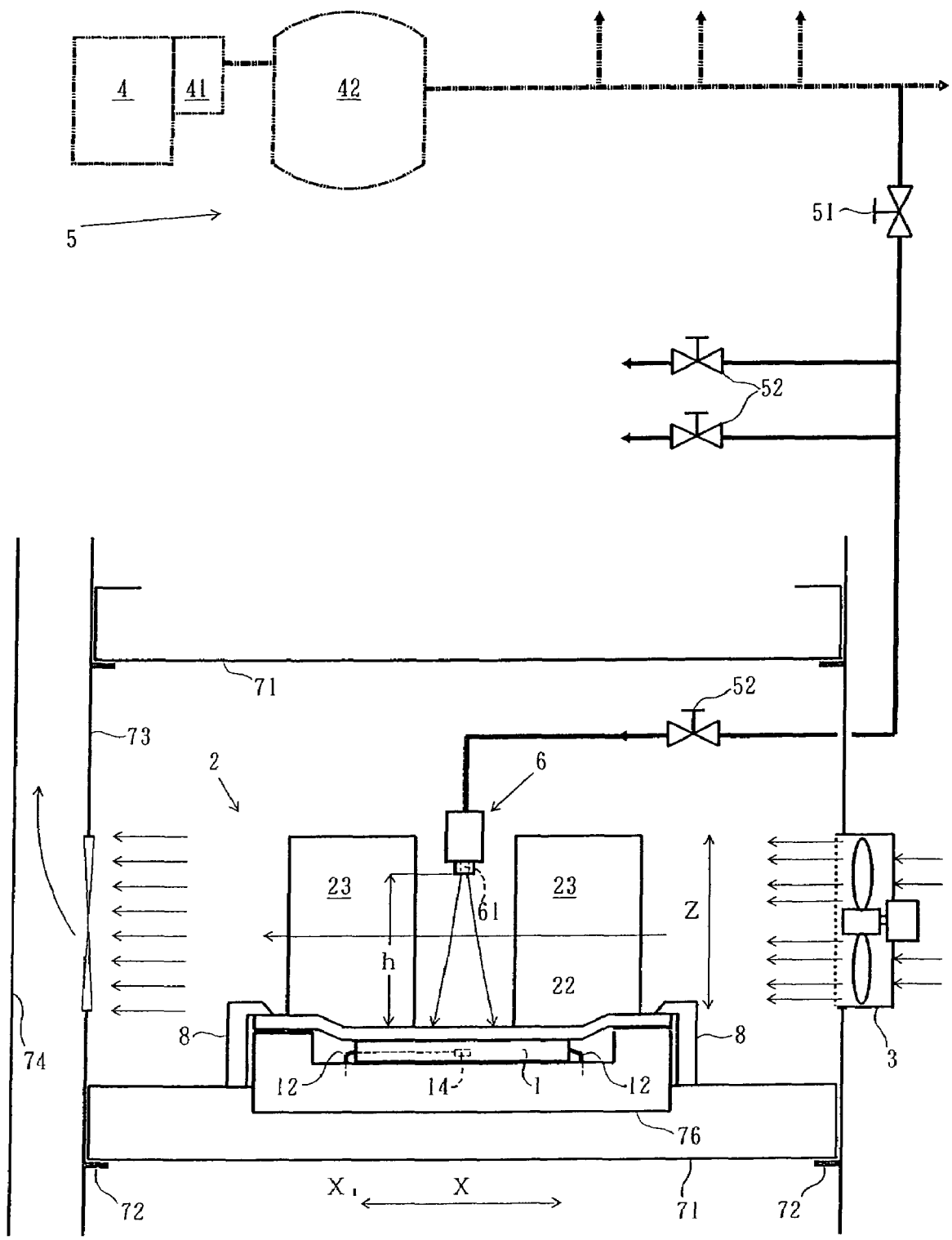
F I G . 1

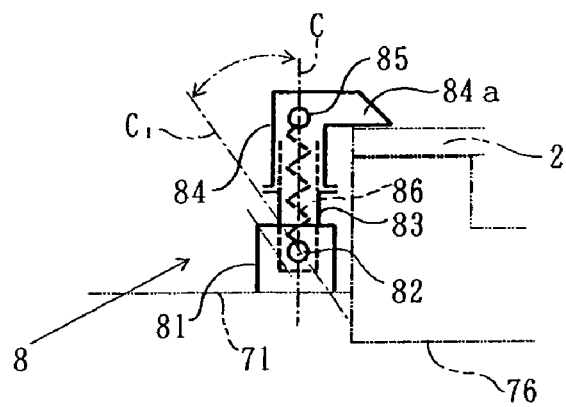
F I G . 4
(a)
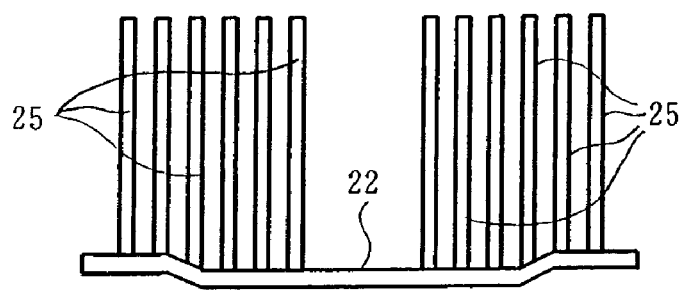
(b)
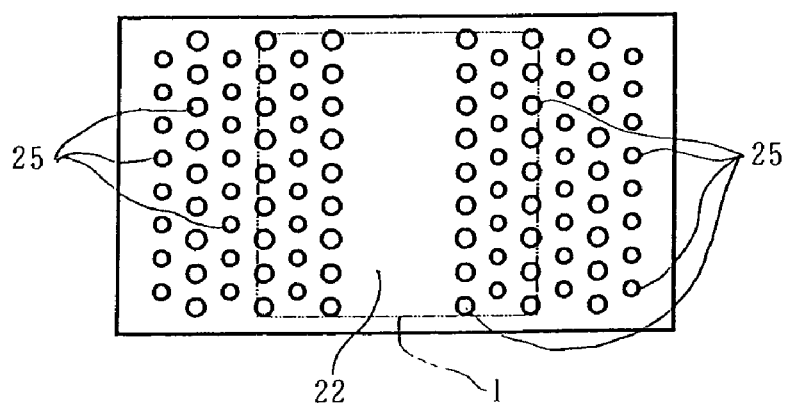
F I G . 5

COOLING APPARATUS

BACKGROUND OF THE INVENTION

The present invention relates to a cooling apparatus capable of conducting cooling so as to obtain the target temperature of a semiconductor device that comprises a plane-like surface and generates heat to above the target temperature and has the temperature of the one surface rising when electric current is passed therethrough.

A burn-in apparatus for semiconductor devices (referred to hereinbelow as "devices") is generally known in which a multiplicity of devices are mounted on burn-in boards, the boards are stacked in multiple stages in a temperature controlled chamber, electric current is passed through the devices, and hot air with a temperature adjusted to the fixed temperature, for example 125° C., is caused to flow parallel to the burn-in boards inside the chamber and circulate, while uniformly cooling the multiplicity of devices (see, for example, Patent References 1, 2). With such a burn-in apparatus, in the case of conventional devices, the internal temperature of the devices generating heat when a current is passed therethrough is adjusted to a temperature appropriate for the burn-in test, which is about 150° C., correspondingly to the temperature of the circulating hot air and a burn-in test of the multiplicity of devices can be conducted with good efficiency.

Furthermore, Patent Reference 3 describes, as the conventional technology, that detecting the temperature inside the chamber and maintaining it at a constant level alone does not directly control the temperature of the device itself and, therefore, a diode is formed in a hollow space of a semiconductor chip and the junction temperature of the semiconductor chip is evaluated based on the electric characteristics of the diode (see the same Patent Reference 3).

Furthermore, the Patent Reference 3 also suggests a burn-in test apparatus in which a wiring section for temperature measurements is disposed over the entire integrated circuit section of each semiconductor chip, the average temperature of the chip is detected via a connection pad provided similarly to the connection pad for current supply to the integrated circuit section, the air with adjusted temperature is supplied from air-blow fans disposed correspondingly to each semiconductor chip in a temperature adjusting apparatus, and the air flow amount supplied to each chip is controlled so that the average temperature of the chip becomes the target burn-in temperature.

On the other hand, in recent years, devices generating a large amount of heat, for example, up to about 300 W when an electric current is passed therethrough, have appeared on the market and the burn-in apparatuses and cooling apparatuses for printed substrates on which such devices generating a large amount of heat are mounted have to be adapted to conduct the burn-in test of such devices that generate a large amount of heat. However, with the above-described conventional apparatus of a generic hot air circulation system, because the one surface of the device is cooled directly using one type of air, the cooled surface area and/or the amount of cooling air is insufficient and the large amount of heat generated by the device cannot be removed.

Accordingly, as a cooling apparatus for a printed substrate mounted with devices, including devices that generate a large amount of heat, a cooling apparatus for semiconductor elements has been suggested wherein cooling air is made to flow from one blower serving as a common air cooling means to a cooling chamber above the printed substrate onto which elements generating a small amount of heat and elements generating a large amount of heat, which correspond to the devices, have been mounted, cylindrical and teacup-shaped accordion fins are brought into contact with one portion of each surface of the elements generating a small amount of heat and elements generating a large amount of heat and via these fins the elements are collectively cooled, and with respect to the elements generating a large amount of heat, high pressure air is sent into the teacups through a nozzle of a high pressure air passage by a small high-pressure fan (see Patent Reference 4).

With the teacup-shaped fins of this cooling apparatus, because the air on the inside and on the outside of the fin is separated by the fin, the air on each side does not mix directly and so the air on each side can be made to perform its cooling function independently, but because one integrated fin is touching a portion of an element surface and is spread out so as to occupy a large volume: the flow of air in the cooling chamber is considerably disrupted; since there is only one fin, even though it is accordion-shaped, the area that is cooled is small; the area of the base portion of the fin connected to the contact section that touches the surface of the element is small and this is only touching one portion of the element surface; and although the air flow is at higher pressure than it would be with a blower, because it is being pushed by a high pressure fan, the speed is not great. For reasons such as these, in the end the cooling effect for the element generating a large amount of heat is not sufficient.

Also, similarly, as a cooling apparatus for a printed substrate mounted with devices, including devices that generate a large amount of heat, a heat sink direct air injection system has been suggested wherein cooling air is commonly supplied, similarly to the above, to a cooling chamber above a printed substrate mounted with heat sinks, including heat sinks generating a large amount of heat that correspond to devices that generate a large amount of heat, and pressurized air from a blower is supplied through a small air duct so that via an orifice of a size that corresponds to the amount of heat generated by the device the air falls directly from the one surface of the device toward a central space provided in the device (see Patent Reference 5).

With this system, because air inside and outside of the heat sink has been separated by the central space, the air on each side does not mix directly and so mutually independent cooling effects can be produced, but such a system can only be used for special devices that have a hole such as a central space, and although air flow is at higher pressure than it would be with a blower, because it is being pushed by an air blower that has a discharge pressure limited to 100 KPa or so, the speed is not great. For reasons such as these, in the end the cooling effect for the elements generating a large amount of heat is not sufficient.

Also, an air injection type temperature control apparatus is known, wherein air that has been compressed by a compressor and cooled is sprayed by air injection nozzles arranged on both sides of a device, and both sides of each individual object are cooled directly (see Patent Reference 6). However, this apparatus entails the following problems: because it is configured to cool both sides of the device, it cannot be adapted to a usual burn-in apparatus in which one surface side of the device serves as a mounting surface for a connector providing for electric connection to the device; because the entire amount of the heat generated by the device is removed only by the amount of air hitting the surfaces, it is difficult to control the temperature of the device accurately enough by just controlling this amount of air; because the sprayed air falls on the surfaces of the device directly, these surfaces are affected thereby, e.g., become stained or discolored.

[Patent Reference 1] Japanese Patent Application Laid-open No. H8-211122 (FIG. 1 and relevant explanation in the specification).

[Patent Reference 2] Japanese Patent Application Laid-open No. H11-231943 (FIG. 1 and Par. No. 25 in the specification).

[Patent Reference 3] Japanese Patent Application Laid-open No. 2000-97990 (FIG. 4 and Par. Nos. 3, 4 in the specification; FIGS. 1 and 2 and relevant explanation in the specification).

[Patent Reference 4] Japanese Patent Application Laid-open No. H1-28896 (especially the second figure and relevant explanation)

[Patent Reference 5] U.S. Pat. No. 4,851,965 (especially the second and third figures and relevant explanation)

[Patent Reference 6] Japanese Patent Application Laid-open No. H4-321113 (FIG. 1 and relevant explanation in the specification).

BRIEF SUMMARY OF THE INVENTION

It is an object of the present invention to resolve all of the above-described various problems inherent to the conventional technology, and to provide a cooling apparatus that, along with having a large cooling effect, can cool a device with good temperature accuracy and can be used for cooling a device generating a large amount of heat, without affecting the surface of the device.

In order for the present invention to resolve the problems described above, a first aspect of the invention provides a cooling apparatus capable of conducting cooling so as to obtain a target temperature of a semiconductor device that comprises a plane-like one surface and generates heat to above the target temperature and has the temperature of the one surface rising when electric current is passed therethrough, this apparatus comprising a cooling body comprising a pressure-contact surface to be pressed against the one surface, a cooled surface that is on the opposite side of the pressure-contact surface, and a multiplicity of cooling members vertically arranged, such that air can pass from one side to the other side, on the outer surface located outside the inner surface that corresponds to a portion of certain range that includes the center of the one surface within the cooled surface; an air supply means capable of supplying the air; and a compressed air supply means that can supply by discharging with a sprayer compressed air that has been compressed by a compressor and from which heat has been released, so that the compressed air hits a portion of specific range that includes a position that corresponds to the center within the inner surface from a direction that faces the inner surface.

With a second aspect of the invention, in addition to the above-described features, there are comprised a temperature detection means for detecting a temperature of the semiconductor device, a compressed air flow rate adjustment means that can adjust the flow rate of the compressed air, and a control means for controlling the compressed air flow rate adjustment means such that the temperature detected by the temperature detection means becomes the target temperature.

With a third aspect of the invention, in addition to the above-described features, there are comprised an air flow rate adjustment means that can adjust the flow rate of the air, a second control means for controlling the air flow rate adjustment means such that when a difference between the detected temperature and the target temperature is equal to or higher than a prescribed value, the difference becomes the prescribed value, wherein the control means controls the compressed air flow rate adjustment means so that when the difference becomes less than the prescribed value, the temperature detected by the temperature detection means becomes the target temperature.

With the fourth aspect of the invention, in addition to the features of the first aspect of the invention, the compressed air supply means mixes the compressed air and heat transfer medium liquid so that the heat transfer medium liquid can be atomized and supplied by the compressed air.

As described hereinabove, in the first aspect of the invention, a cooling apparatus capable of conducting cooling so as to obtain a target temperature of a semiconductor device that comprises a plane-like one surface and generates heat to above the target temperature and has the temperature of the one surface rising when electric current is passed therethrough first of all has a cooling body, and because this cooling body comprises a pressure-contact surface that is to be pressed against the one surface, which as described above rises in temperature when electric current is passed therethrough, and a cooled surface that is on the opposite side thereof, this cooling apparatus can transfer the heat of the heat-generating semiconductor device from the one surface via the pressure-contact surface to the cooled surface.

This cooling body is provided with a multiplicity of cooling members; because this multiplicity of cooling members is vertically arranged such that air can pass from one side to the other on the outer surface located outside the inner surface that corresponds to a portion of fixed range that includes the center of the one surface that rises in temperature and because the cooling apparatus has an air supply means that can supply this type of air for cooling, when the air supply means is operated such that the air passes through the multiplicity of cooling members, the heat of the outer surface can be sufficiently released from the surfaces of the cooling members. This is possible because the number of the cooling members is large and, therefore, the surface area thereof is sufficiently large and also because the multiplicity of cooling members are arranged vertically on the outer surface and, therefore, the area of the base portions is sufficiently large.

Furthermore, the cooling apparatus has a compressed air supply means for the inner surface of the entire cooled surface that corresponds to a portion of fixed range that includes the center of the one surface that rises in temperature, and through this means, the compressed air that has been compressed by a compressor and from which heat has been released can be discharged from a sprayer and supplied so as to hit a portion of specific range that includes a position that corresponds to the center within the inner surface that corresponds to the above-mentioned portion of fixed range from a direction that faces the inner surface. Therefore, by operating the compressed air supply means, the compressed air is discharged from the sprayer, the inner surface is cooled directly by the discharged air that has become at the pressure of outside air, and the heat of the inner surface can be removed to a suitable extent.

Specifically, with an apparatus that supplies compressed air compressed by a compressor, the compressed air is air at a pressure of 0.1 MPaG or more, the compressed air that is used for a variety of applications in a plant or the like is usually at a pressure of about 0.5-1 MPaG, and air from which heat has been released, e.g., by an air cooler, an air reservoir, or a piping system mostly provided as an attachment to a compressor is at a temperature close to a normal temperature that is an ambient temperature; therefore, when this air is discharged from a sprayer inside a cooling apparatus disposed in a room of a plant or the like where air is normally at an atmospheric pressure to obtain a discharged air with a pressure reduced down to the atmospheric pressure, the flow speed of the discharged air becomes extremely high, and even when it is discharged from a small outlet of the sprayer with a diameter of, for example, about 1 mm, a considerable amount of air hits a portion in a specific range of the inner surface determined by the flow speed and the height of the sprayer at a high speed and with a lower temperature than surrounding air, thereby making it possible to remove heat from this surface and the area adjacent thereto with very high efficiency.

In this case, because the inner surface corresponds to a portion of fixed range including the center of the one surface, the inner surface includes the central portion from which heat does not easily dissipate of the one surface that rises in temperature. Therefore, heat of this central portion can be removed efficiently with the discharged air. Furthermore, the discharged air hits the specific range, flows along the inner surface, and absorbs heat from this surface. It also flows on the outer surface and is used as additional air for direct cooling of this surface and for cooling the cooling members.

Furthermore, because two types of air, including the air supplied from the air supply means and the discharged air from the compressed air supply means, can be supplied separately and independently with respective supply means, the total heat removal capacity for removing heat generated by the device is increased. Moreover, the amount of each type of air can be set with a certain degree of freedom and heat generated by the device can be divided at an appropriate ratio and removed. As a result, for example, if the amount of heat to be removed by the discharged air is set considerably smaller than the amount of heat to be removed by the supplied air, the amount of heat removed from the device by cooling can be finely adjusted and the device temperature can be accurately brought to the target temperature, for example, by maintaining the amount of supplied air at a level close to the maximum amount and changing the amount of the discharged air.

As described above, in order to obtain a cooling effect by both the air blow cooling and the cooling by compressed air discharge, a flow state is realized such that identical gases cross each other due to the flow speed difference. Therefore because only air is used, the cooling medium system is greatly simplified. Also, with the low-cost cooling apparatus using little additional equipment, a considerable amount of the heat from the devices generating a large amount of heat of up to 300 W, which could not be handled by the conventional apparatuses, can be reliably removed and operation can be ensured such that the temperature is maintained at a target temperature of, for example, about 150° C. as required for a burn-in test of the device.

With the second aspect of the invention, the cooling apparatus comprises a temperature detection means for detecting the temperature of the semiconductor device, a compressed air flow rate adjustment means capable of adjusting the flow rate of the compressed air, and a control means for controlling the compressed air flow rate adjustment means so that the temperature detected by the temperature detection means becomes the target temperature. Therefore, when a cooling effect of the device attained through these means is stabilized by maintaining constant operation conditions, the device can be automatically cooled to the target temperature with good accuracy without controlling or adjusting the air supply means. Therefore, labor can be saved and temperature accuracy can be increased.

Furthermore, such a cooling apparatus is usually configured to cool a large number of devices. In this case, the amount of air supplied to each device by the air supply means is not even, which causes spread in the amount of heat removed by the air supply means among the devices. However, even with respect to such a spread, temperature accuracy of each device can be improved by changing the amount of heat removed by the discharged air from the compressed air.

The third aspect of the invention is configured such that in addition to the above-described features, there are provided an air flow rate adjustment means capable of adjusting the flow rate of the air and a second control means for controlling the air flow rate adjustment means so that when the difference between the detected temperature and the target temperature is equal to or higher than a prescribed value, the difference becomes the prescribed value, and the control means controls the compressed air flow rate adjustment means so that when the difference becomes less than the prescribed value, the temperature detected by the temperature detection means becomes the target temperature. Therefore, when the detected temperature is far from the target temperature, the prescribed temperature that can be set close to the target temperature, but with a certain difference therefrom, can be attained rapidly via a large heat removing effect by controlling the amount of supplied air of the air supply means capable of removing a relatively large amount of heat via a multiplicity of cooling members. Thereafter, the amount of compressed air providing for a relatively small heat removal effect is controlled and the target temperature is obtained with good accuracy. Thus, temperature control can be conducted rapidly and with high accuracy.

With the fourth aspect of the invention, in addition to the features of the first aspect of the invention, the compressed air supply means mixes the compressed air and heat transfer medium liquid and the heat transfer medium liquid is atomized and supplied by the compressed air. Therefore, supplying fine particles of the heat transfer medium liquid to the cooling body to which heat of the heat-generating device was transferred makes it possible to evaporate the fine particles and to remove the heat of the device in a large quantity and effectively.

BRIEF DESCRIPTION OF THE DRAWINGS

Accompanying the specification are figures which assist in illustrating the embodiments of the invention, in which:

FIG. 1 is an explanatory drawing illustrating an example of the configuration of the cooling apparatus employing the present invention;

FIG. 4 is a front view of a fixture for fixing the cooling body to the burn-in board;

FIG. 5 shows another example of a cooling body: (a) is a front view and (b) is a plan view;

DETAILED DESCRIPTION OF THE INVENTION

Figure 2:
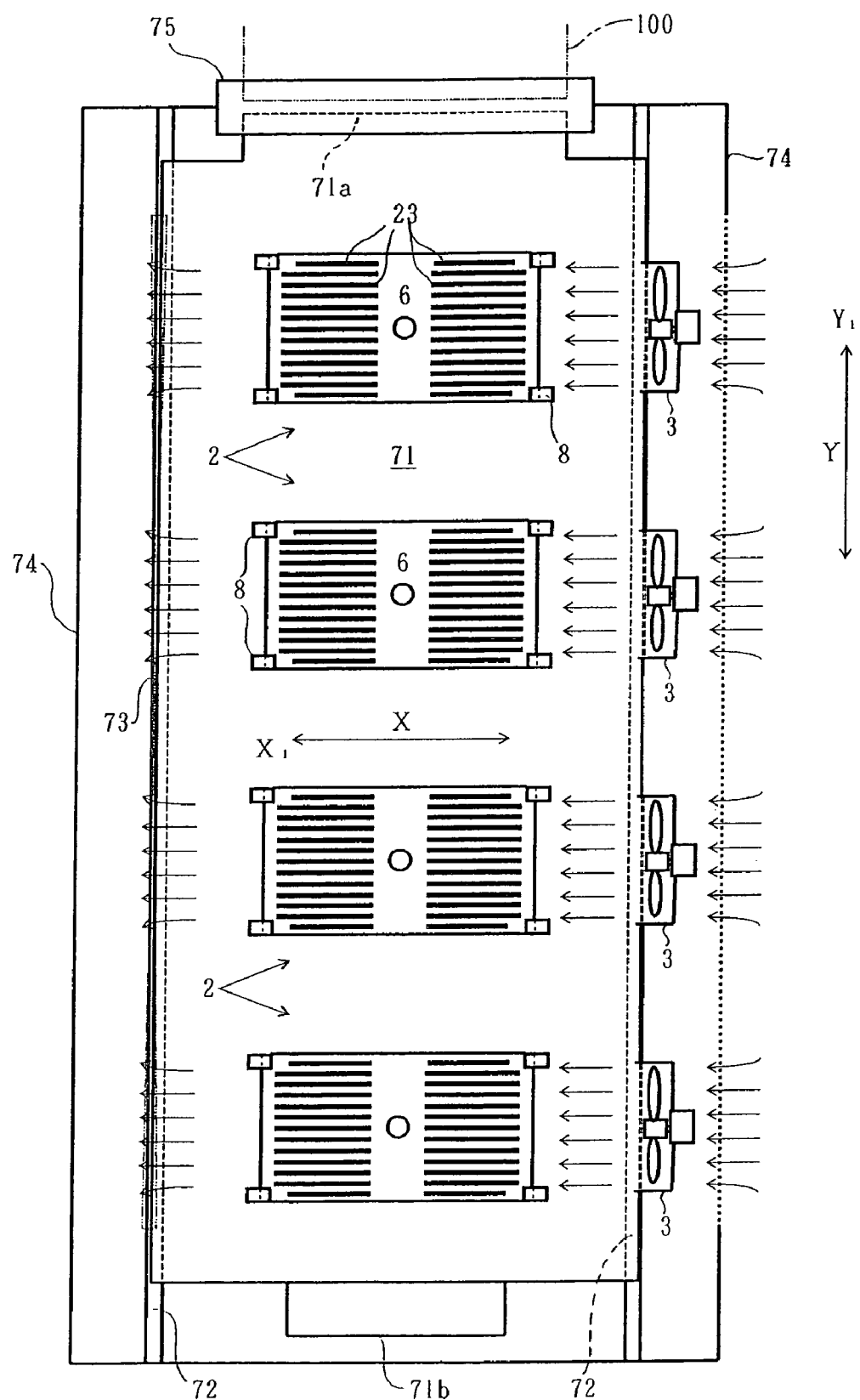
FIG. 2 is an explanatory drawing of the cooling apparatus showing a plan view.
Figure 3:
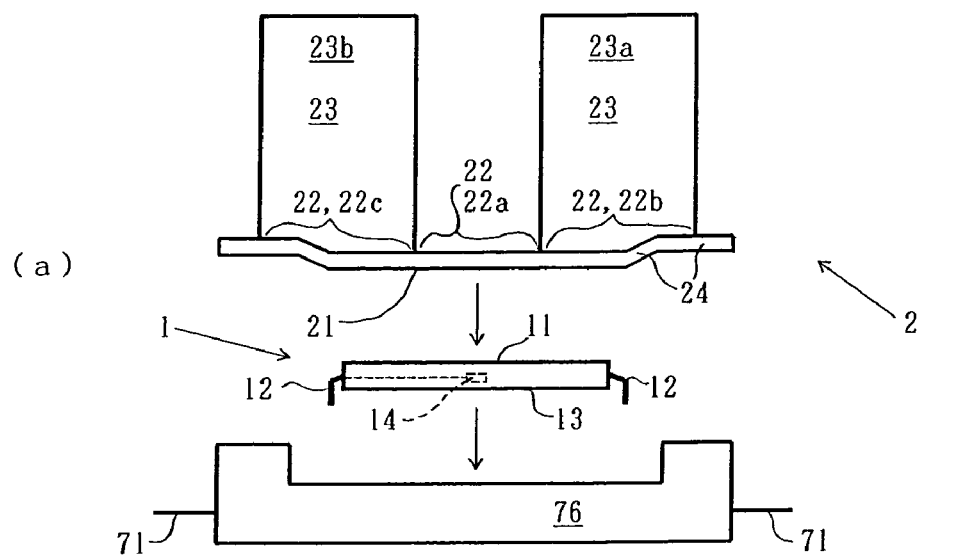
FIGS. 3(a) through (c) are respectively a front view showing a state where a cooling body, a device and a socket are separated, a plan view of the cooling body, and a plan view of the device.
Figure 3:
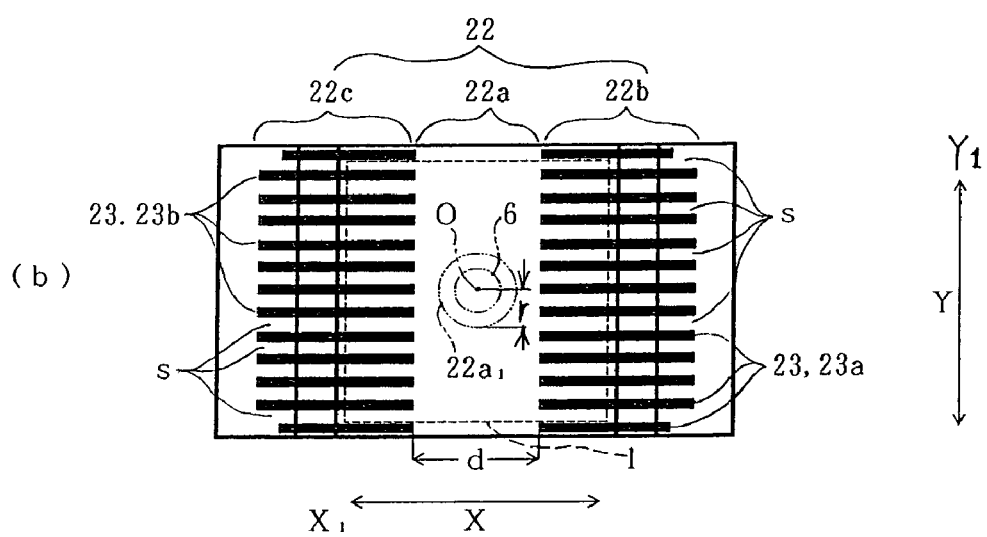
Figure 3:
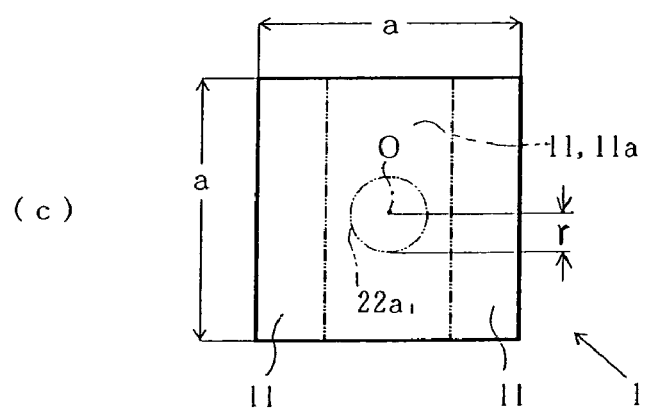

FIGS. 1 and 2 show examples of the entire structure of the cooling apparatus employing the present invention. FIG. 3 shows a configuration example thereof. FIGS. 1 and 2 show portions of one stage of the apparatus having a multistage configuration usually comprising 5-10 stages. Other stages are configured identically.

The cooling apparatus of the present example is an apparatus employed in a burn-in test of a device 1 that comprises an upper surface 11, in the present example a flat one surface, and that is formed so that it generates heat when electric current is passed therethrough up to a temperature higher than a temperature t, in the present example about 150° C., as the target temperature, and the temperature of the upper surface 11 also rises accordingly, this cooling apparatus being capable of cooling the device 1 to the temperature t. This cooling apparatus comprises a cooling body 2, a blower 3 as an air supply means, a compressor 4 comprising a compressed air supply means, a compressed air pipe system 5, and a sprayer 6.

A burn-in board 71 (referred to hereinbelow simply as "board 71") for carrying the device 1, a support plate 72 for supporting the burn-in board inside the cooling apparatus, inner and outer casings 73, 74, and a connector 75 for electric connection to a relay board 100 are provided as the usual structural components of the cooling apparatus. A space between the inner and outer casings 73, 74 serves as an air release duct.

The board 71 is composed of a printed substrate, a socket 76 is mounted thereon, and an edge connector 71a for detachable connection to the connector 75 is formed at the distal end thereof. On the rear end, a knob 71b is attached. As burn-in test equipment, in addition to the cooling apparatus, a driver/test board, a relay board, and a control board (not shown in the figure) are disposed outside the cooling apparatus and sequentially connected to the relay board 100. These components make it possible to supply power to the device 1, send necessary electric signals, and actuate the device 1 for a burn-in test.

The device 1 is of a high heat generation type that generates an amount of heat of about 300 W in a conductive state thereof and, similarly to the usual devices, has a structure comprising a multiplicity of pins 12 on the periphery thereof, as shown in FIG. 3(a), and when the device is detachably attached to the burn-in board, these pins are detachably attached to the socket 76. The upper surface 11 is formed from a metal with good thermal conductivity such as copper plated with nickel, so as to provide for good heat dissipation and is a flat surface. The lower surface 13 is usually made of a heat-resistant resin.

Because of the importance of temperature control, some of these high heat generation type of devices 1 have a structure with a temperature sensor 14 incorporated therein. In this case, the sensor 14 is connected to the appropriate pins of a multiplicity of pins 12 and the leads thereof are led out as an external wiring from a control board (not shown in the figure) via a printed wiring of the board 71 from the socket 76 used for temperature display or temperature control. When the temperature sensor 14 is not incorporated in the device 1, a structure is used in which an alternative temperature sensor is mounted on the socket 76 so as to come into contact with the lower surface 13 of the device 1 and similarly connected to the printed wiring of the board 71.

The cooling body 2, as also shown in FIGS. 3(a) and (b), comprises a pressure-contact surface 21 pressed against the upper surface 11 of the device 1, a cooling upper surface 22 serving as a cooled surface opposite to the pressure-contact surface, and a multiplicity of fin-shaped heat-dissipating plates 23 serving as a multiplicity of cooling members. As shown in FIG. 3(c), in the present example, the device 1 is formed as a square with a side of 4 cm, and the pressure-contact surface 21 has a larger surface area so as to cover the upper surface 11. On the periphery of the pressure-contact surface 21, an enlarged portion of the cooling upper surface 22 and a step portion 24 are formed so that the cooling upper surface 22 becomes larger and the pressure-contact surface 21 can be reliably pressed against the entire upper surface 11 with a sufficient pressure force.

Of the cooling upper surface 22, on the outer surfaces 22b and 22c located outside the inner surface 22a corresponding to the central portion 11a that is a portion of a certain range including the center O of the upper surface 11 of the device, a multiplicity of heat-dissipating plates 23 are provided to stand in a direction perpendicular to the inner surface 22a of the cooling upper surface 22 so that the air can pass through each space s between the multiplicity of heat-dissipating plates 23 from the side of the blower 3 that is one side to the side of the inner casing 73 that is on the other side, in the $X_1$ direction shown in the figure. In the present example a total of 26 heat-dissipating plates 23 are formed by 13 heat-dissipating plates in the width direction Y on each side so that a space d is provided in the lengthwise direction X of the cooling upper surface 22 with respect to the center O.

A lightweight material with good thermal conductivity such as aluminum or aluminum alloy is used as a material for the cooling body 2 including the heat-dissipating plates 23. The shape and size of the inner surface 22a are determined correspondingly to the amount of air ejected from the sprayer 6, size and shape of the cooling upper surface 22 and heat-dissipating plates 23, the number of the sprayer 6, and the like, so as to increase the cooling effect and facilitate the manufacture of the cooling body 2. For example, as an alternative to the configuration in which, as in the present example, all the heat-dissipating plates are divided between the two sides, a configuration may be employed with the arrangement of heat-dissipating plates such that space portions in the shape of a square, a circle or an oval are formed in continuous heat-dissipating plates.

The cooling body 2 is attached to the board 71 with appropriate means so that the pressure-contact surface 21 of the cooling body is well pressed against the upper surface 11 of the device 1. In the present example, as shown in FIG. 4, as a fixture 8, there are provided a base 81 attached to the board 71, a pin 82 attached to the base, an inner guide 83 supported so that it can be tilted between the central line C and $C_1$ with respect to the base, an outer guide 84 interlocked with the inner guide, a pin 85 fixed to the outer guide, a spring 86 interlocked with the pins 82 and 85 and pulling the outer guide 84 in the direction of the inner guide 83, and a hook portion 84a integral with the outer guide 84.

The blower 3 supplies air so that it can pass through each space s between the multiplicity of heat-dissipating plates 23 in the $X_1$ direction as described above. In the present example, as shown in FIGS. 1 and 2, four blowers are provided in each stage so as to supply air independently to four cooling bodies 2 attached on the burn-in board 71 of each stage. Thus, one blower 3 supplies air so as to include the full range of the width Y direction and the height Z direction of the heat-dissipating plates 23 of one cooling body.

In this case, as the blower 3, an axial flow blower with a discharge static pressure of about, for example, 0.3-0.4 KPaG is used. If the diameter of the blade thereof is close to the height and full width of the heat-dissipating plates 23, air discharged from the blade can be appropriately diffused to a certain degree and the air can be supplied almost parallel to the heat-dissipating plates in the range of the height and full width of the heat-dissipating plates 23. The amount of air supplied from the blower 3 can be set so as to remove as much heat from the heat-dissipating plates 23 as possible, but because the amount of heat that can be removed thereby is limited, when the device 1 is of the above-described high heat generation type, the amount of supplied air is set so as to remove the amount of heat about, for example, 80% of the maximum amount of generated heat.

In another possible arrangement, one blower is provided for the entire number of cooling bodies 2 of one stage or all the stages, an opening for supplying air is provided in a position corresponding to each heat-dissipating plate 23, and a damper is provided, if necessary, so that almost the same amount of air can be supplied to each heat-dissipating plate 23.

The compressor 4 and the compressed air pipe system 5 are provided, in the present example, as equipment for supplying compressed air for general applications in the entire plant such as a semiconductor manufacturing plant where the cooling apparatus is used. With this type of compressed air system, a pressure is normally set at about 0.7-0.9 MPaG. On the discharge side of the compressor 4, an air cooler 41 and an air tank 42 are provided as shown in the figures, and the compressor is automatically operated so that a compressed air pressure in the air tank 42 comes within the above described range.

Compressed air to the cooling apparatus can be supplied from this type of compressed air pipe system 5 to the sprayer 6 via main valve 51 for a cooling apparatus serving as a common valve, and the individual air valve 52 provided to each cooling body 2 and sprayer 6. If the compressed air supply system is not provided as such plant equipment, an identical small-capacity compressor or the like is provided as a cooling apparatus.

The sprayer 6 has a usual structure and so is not shown in greater detail in the figures, but it comprises a compressed air chamber and a nozzle 61 and can discharge and supply the compressed air, which was compressed with the compressor 4 and had heat dissipated therefrom in the air cooler 41, the air tank 42, and the piping of compressed air system 5, so that the compressed air is sprayed onto the inner surface 22a and hits the direct fall surface $22a_1$ in the form of a circle with radius r as a portion in a specific range that includes a position corresponding to the center O of the surface from the position at the height h above this surface. Because the amount and flow speed of the air discharged from the sprayer 6 and the above radius r are determined by values such as a pressure in the compressed air chamber, a diameter of the nozzle 61, and the above height h, in an actual device, the above diameter, pressure, and h are determined so that the amount of air, flow speed and r assume the appropriate values.

Furthermore, a water supply system for supplying, for example, water as a heat medium liquid may be added to the compressed air supply system 5 and an air mist spray gun capable of introducing and mixing compressed air and water supplied from the water supply system, converting the water into mist, which consists of fine particles, and supplying the mist with the compressed air may be used as the sprayer 6.

The cooling apparatus described hereinabove is operated and demonstrates its effects as follows:

The blower 3 is set into the operation state. Furthermore, the compressed air supply system 5 of a plant or the like is in a usual operable state. The opening degree of each individual air valve 52 is adjusted in advance. When a burn-in test of the device 1 is conducted under such conditions, first, the device 1 and cooling body 2 are attached to the board 71. Thus, as indicated by the arrow in FIG. 3(a), the device 1 is mounted on the socket 76 attached to the board 71, the cooling body 2 is arranged in a position in which the pressure-contact surface 21 is in contact with the upper surface 11 of the device, the fixture 8 is tilted to a position of the central line $C_1$ to place the pressure-contact surface 21 on the upper surface 11, the outer guide 84 is pulled, the fixture 8 is set in the position of the central line C to be hung on the upper end of the step portion 24 of the cooling body 2, and the plane surface position is finely adjusted to stabilize the position of the cooling body 2. As a result, the pressure-contact surface 21 is pressed against the upper surface 11 by an appropriate force of the spring 86, and heat of the upper surface 11 can be transferred to the pressure-contact surface 21 of the cooling body 2 under a sufficiently small thermal resistance. By forming the step portion 24, as in the present example, makes it possible to obtain an especially favorable pressure contact state.

If all the devices 1 and cooling bodies 2 are attached to the board 71, both ends of the board 71 in the width X direction are placed on the support plate 72 of the cooling apparatus, the board is fed in the longitudinal direction $Y_1$, which is also the widthwise Y direction of the cooling body 2, and the edge connector 71a located at the distal end thereof is inserted into the connector 75. As a result, the devices I are connected to the control board via the board 71, relay board 100, drive/test board and relay board (not shown in the figure) in the order of description.

As a result of the above-described operations, a state is assumed in which a burn-in test can be implemented. The test device is operated, electric current is supplied to the device 1, and necessary electric signals are applied, thereby setting the device 1 into an operation state. At the same time or somewhat later, the blower 3 is operated. When the device 1 is actuated, power of up to about 300 W is consumed, heat is generated corresponding to this power, and the temperature of the device 1 gradually rises from the initial normal temperature state. However, in this initial state, because the temperature of the upper surface 11 of the device 1 is not sufficiently high, only the blower 3 is operated, as described hereinabove.

If the blower 3 is operated, air with the temperature $t_0$ taken in from a room outside of the cooling apparatus where this device is disposed is supplied to the cooling body 2 and caused to pass through all the portions of the spaces s between the heat-dissipating plates 23. If the device 1 generates heat, the generated heat is taken away from the upper surface 11 by the air that passes from the heat-dissipating plates 23 via the pressure-contact surface 21 and the cooling upper surface 22. In this case, the cooling upper surface 22 is enlarged by the heat-dissipating plates 23 and has an extremely large cooling area and the heat-dissipating plates 23 take up a considerable portion of the area of the cooling upper surface 22. Therefore, the combination of the heat-dissipating plates 23 and air supply with the blower 3 makes it possible to obtain a sufficiently large amount of removed heat such as about 80% of the total amount of removed heat necessary for removing the generated heat, even when the device is, for example, a device of the above-described high heat generation type.

If the device 1 is thus set to the operation state by continuously supplying electric current while air cooling the device with the blower 3, when the device 1 is of a high heat generation type, the amount of removed heat is lacking, for example, by 20% as described above, in comparison to the amount of generated heat, and the temperature of the device 1 rises accordingly. Therefore, if the detected temperature ta of the temperature sensor 14 approaches the target temperature t=150° C. and becomes, for example, 145° C., the main air valve 51 for supplying compressed air is opened. As a result, compressed air is supplied from the individual air valve 52 to the sprayer 6, and the air is discharged from the nozzle 61 so as to hit the direct fall surface $22a_1$ of the cooling upper surface 22.

As a result, the 20% or so of the amount of generated heat that is lacking from the amount of heat removed by air blowing is removed by the discharged air, and ta gradually reaches 150° C. and is thereafter held at this temperature. With the individual air valve 52, the flow rate is adjusted to the amount of removed heat of about 20%, rather than to the total amount of removed heat. Therefore, a highly accurate amount of removed heat can be obtained and the burn-in temperature accuracy can be improved. Because the individual air valve 52 is adjusted in advance, ta within an allowable range of the burn-in temperature close to 150° C. can be obtained with any devices, but when ta of a specific device fluctuates from 150° C. to the degree sufficient to exceed the allowable range due to fluctuations of operation conditions or the like, the opening degree of the individual air valve 52 corresponding to this device is further adjusted.

Heat removal by compressed air will be further explained below.

If the pressure in front of the nozzle of the sprayer 6 after the adjustment with the individual air valve 52 is denoted by P and the pressure after discharge is an atmospheric pressure Pa, then the flow speed V and flow rate q of the air that passes through the nozzle are set correspondingly to the pressure difference (P−Pa)=ΔP and the nozzle diameter. Because this flow speed V is extremely high, the discharged air advances radially so as to penetrate the air flow created by the blower 3, and once it has advanced through the distance of height h, as shown in FIG. 1, while being accompanied by air present in the path section and around it, it hits the direct fall surface $22a_1$ in the circle with a radius r. From this surface, the discharged air expands radially along the cooling upper surface 22, particularly flowing in a large quantity in the direction $X_1$ that is the direction of the air flow from the blower, and is integrated with this flow.

Based on the test results, when the height h of the sprayer 6 shown in FIG. 1 was set to about 50 mm and the diameter of the nozzle 61 was set to 1 mm, and then compressed air with a pressure of about 0.6 MPaA was discharged therefrom, the radius r of the direct fall surface $22a_1$ shown in FIG. 3(b) could be made to an appropriate size of about 50 mm. Thus, through compressed air discharge, along with directly being able to cool the direct fall surface $22a_1$ and a portion within a certain range radially expanded therefrom, effectively with low temperature air, indirectly the temperature of the air supplied from the blower 3 that rose in temperature by cooling those of the heat-dissipating plates 23 that are upstream 23b can be cooled and the cooling effect on the downstream heat-dissipating plates 23a can be assisted. In this case, because the discharged air flows so as to collide with the direct fall surface $22a_1$, heat exchange ability and a cooling effect can be improved considerably by comparison with those of the usual burn-in apparatus in which air is caused to flow parallel to the cooling upper surface 22.

As a result, even when the sprayer 6 is small and the nozzle 61 has a sufficiently small diameter of about, for example, 1 mm, about 20% of the necessary amount of removed heat can be removed by compressed air supply. By reducing the size of the sprayer 6, it is possible to arrange it in a position above the inner surface 22a of the cooling upper surface 22 and close thereto, thereby reliably hitting the cooling upper surface 22 with the discharged air and reliably obtaining the above-mentioned amount of removed heat.

In order to obtain such an effective cooling effect, it is necessary that the discharged air appropriately accompanied by the blown air reach reliably the cooling upper surface 22 and it is desired that the discharge position of air from the nozzle 61 be set above the inner surface 22 of the cooling body 2 within the range of the height of the heat-dissipating plates 23 and that the accompanying air cooled by the discharged air be the air supplied by the blower. At this time, the entire sprayer 6 or a part thereof sometimes has to be disposed in a position lower than the height of the heat-dissipating plates 23, but because the sprayer 6 can be formed in a small size due to the compressed air supply, even when it is between the heat-dissipating plates 23a and 23b, it does not greatly inhibit the flow of the supplied air.

With the above-described combination of the cooling by supplied air and cooling by compressed air discharge, the cooling apparatus, in which a cooling medium system is greatly simplified because it uses only air, little additional equipment is used, and cost is reduced, makes it possible to remove reliably a very large amount of heat of the devices generating a large amount of heat of up to 300 W, which could not be handled by the conventional apparatuses, and to enable operation in which temperature is maintained at a target temperature of about 150° C. when burn-in of the device is conducted. In the present example, a configuration is used in which one sprayer 6 is provided with respect to one cooling body 2, but even higher cooling effect can be obtained by appropriately increasing the number of sprayers. Furthermore, with the apparatus in which an air mist spray gun is used as the sprayer 6, as described hereinabove, water is converted into mist, and the mist is supplied by the compressed air, the air-mist mixture hits the cooling upper surface 22 of the cooling body 2 to which heat of the device generating heat is transferred, and heat of the device generating a large amount of heat can be removed in a larger amount and more effectively by using vaporization heat of the mist.

When the burn-in time elapses and the test is completed, the electric power supplied to the device is lowered and finally the power supply is cut off. At this time, because ta drops significantly, the main air valve 51 of the compressed air system 5 is closed to stop the cooling by compressed air discharge, and if ta approaches the normal temperature, the operation of the blower 3 is stopped. If one cycle of the burn-in test is completed, the edge connector 71a is drawn out from the connector 75, the burn-in board 71 is pulled out from the cooling apparatus, the fixture 8 is removed, the cooling body 2 is first removed, and then the devices 1 are removed from the sockets 76. The above-described operations are then repeated and burn-in test of a multiplicity of devices is conducted. In this case, attaching and detaching the cooling body 2 are one-touch simple operations, and starting and stopping the blower 3 and opening and closing the main air valve 51 of compressed air are also simple operations. Therefore, when the cooling apparatus of the present invention is used, the burn-in test can be conducted with simple operations.

FIG. 5 shows another example of the cooling body. In the cooling body 2 of the present example, a multiplicity of heat-dissipating rods 25 are attached as cooling members in place of the fin-shaped heat-dissipating plates 23 to the cooling upper surface 22. The heat-dissipating rods 25 may be arranged appropriately, and in the present example, a zigzag arrangement is employed. In this case, the disturbance of the air supplied from the blower 3 increases and heat exchange performance can be improved. With the cooling body comprising such heat-dissipating rods 25, the cooling area and the area in contact with the cooling upper surface 22 also can be increased and the removed amount of heat generated by the device 1 can be increased significantly.

Figure 6:
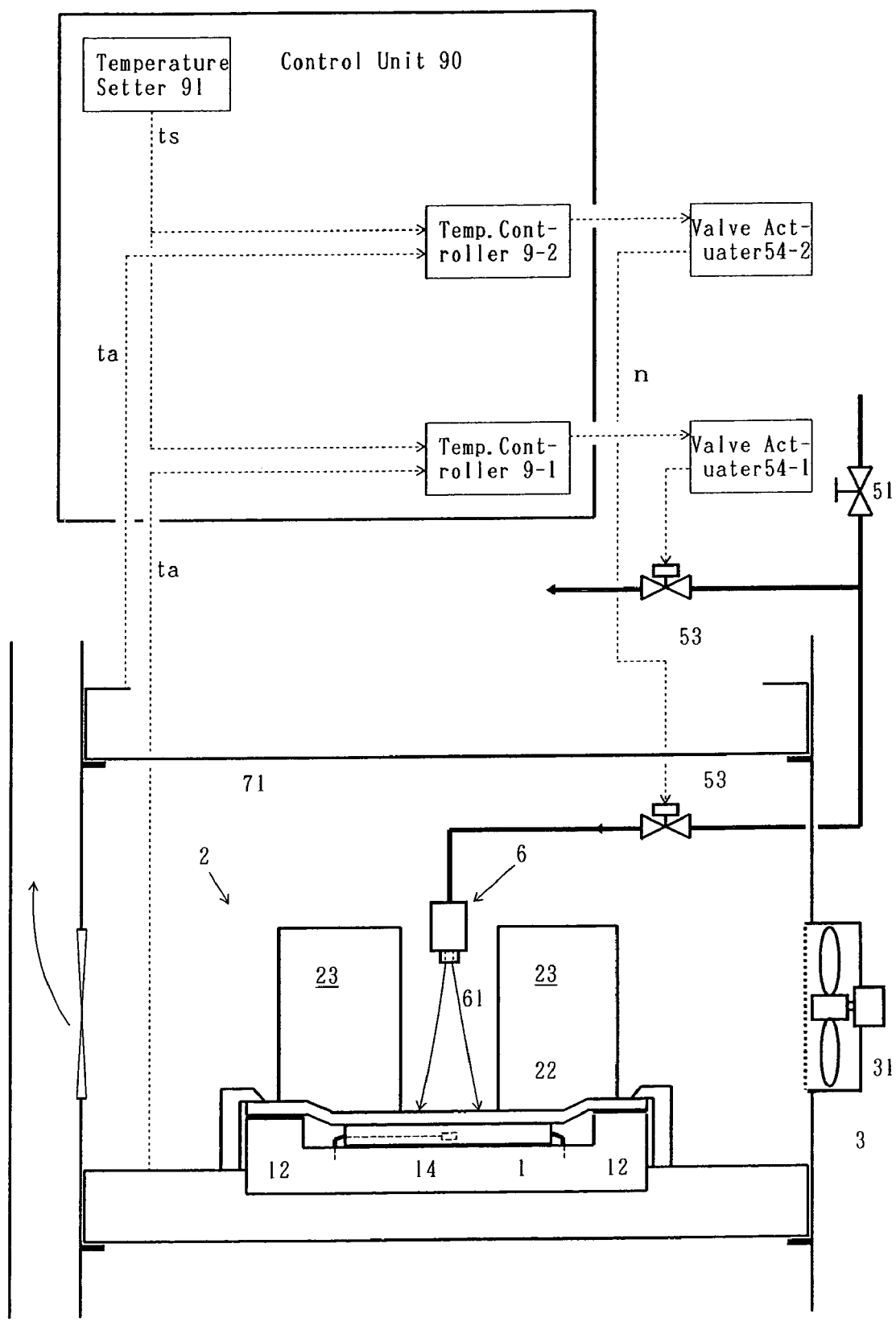
FIG. 6 is an explanatory drawing showing a configuration of the cooling apparatus including a control unit section.

FIG. 6 shows a configuration example relating to automation of the cooling apparatus. The apparatus of the present example comprises a temperature sensor 14 as a temperature detection means for detecting the temperature of the device 1, an individual automatic air regulating valve 53 (referred to hereinbelow as "automatic valve") as a compressed air flow rate adjustment means for adjusting the flow rate of compressed air, a valve actuator 54 for driving the automatic valve, and a temperature controller 9 as a control means for adjusting the automatic valve 53 via the valve actuator 54 so that the temperature ta detected by the temperature sensor 14 becomes a set temperature ts of the device 1 when it is burnt in, this temperature serving as a target temperature. The temperature controller 9 and the below-described temperature setter 91 are provided in a control unit 90.

In the cooling apparatus of the present example, a multiplicity of devices are cooled in multiple columns and multiple stages, and a multiplicity of temperature sensors 14, automatic valves 53, valve actuator 54, and temperature controller 9 are provided with respect to the devices 1. In the present example, only two components of each type indicated as −1, −2 are assumed to be present. Other components are provided in a similar manner. However, in the description provided hereinbelow, the indication of the above-described numbers is omitted.

As described above, the signals of the temperature sensor 14 are fetched from a control board (not shown in the figure) after passing from the socket 76 and burn-in board 71 via a relay board or the like, but in the figure they are shown to be fetched from the burn-in board 71. The automatic valve 53 is driven by a motor (not shown in the figure) rotating in response to, for example, a pulse signal n supplied thereto.

The set temperature ts can be set to any temperature, for example to 150° C., by a temperature setter 91 provided in the control unit 90. This ts is transmitted to the temperature controller 9. In the case where the device 1 does not contain the temperature sensor 14, a provisional temperature sensor is attached, as described hereinabove, and control is conducted by the detected temperature $ta_1$ thereof. In this case, the correspondence of ta and $ta_1$ is clarified in advance by a separate test or the like.

If ta and ts are provided, a pulse signal n provided from the temperature controller 9 to the automatic valve 53 is set to a value corresponding to the value of (ta−ts)=$\Delta t$. Thus, when $\Delta t$=0 and when the automatic valve 53 is at a certain opening degree, if ta becomes 150° C. or larger and $\Delta t$ increases, control is performed so that the opening degree of the automatic valve 53 increases correspondingly to the value of the $\Delta t$, and if ta becomes 150° C. or less and $\Delta t$ becomes negative, control is performed so that the opening degree of the automatic valve 53 decreases correspondingly to this value, that is, the opening degree of the automatic valve 53 decreases corresponding to the increase of absolute value $\Delta t$.

With such a controller 90, if the blower 3 providing for the main amount of removed heat of about 80% is maintained at constant rated operation conditions and the flow rate of compressed air providing for the auxiliary amount of removed heat of about 20% is automatically adjusted, then even when the pressure of a compressed air system changes or the ambient temperature during the test changes to cause a difference between ta and ts such that it exceeds a certain allowable range, the burn-in temperature located within the target range can be automatically obtained, advance adjustment and readjustment during the operation of the individual air valve 52 in the device of FIG. 1 is not required, and operation labor can be saved. Furthermore, in this case, because the range of the small amount of removed heat such as 20% is controlled, the burn-in temperature accuracy obtained within the certain controllable range can be improved.

Further, in an apparatus in which only one blower is provided and the flow is branched to each cooling body with ducts or ports, instead of independently providing four blowers to the respective devices 1 and cooling bodies 2 as shown in FIG. 2, a spread in supplied air cooling can easily occur among the cooling bodies 2, but with this cooling apparatus, too, by automatically changing the amount of heat removed by the discharged air from the compressed air, as in the present example, this spread can be corrected and the temperature accuracy of each device can be improved.

Figure 7:
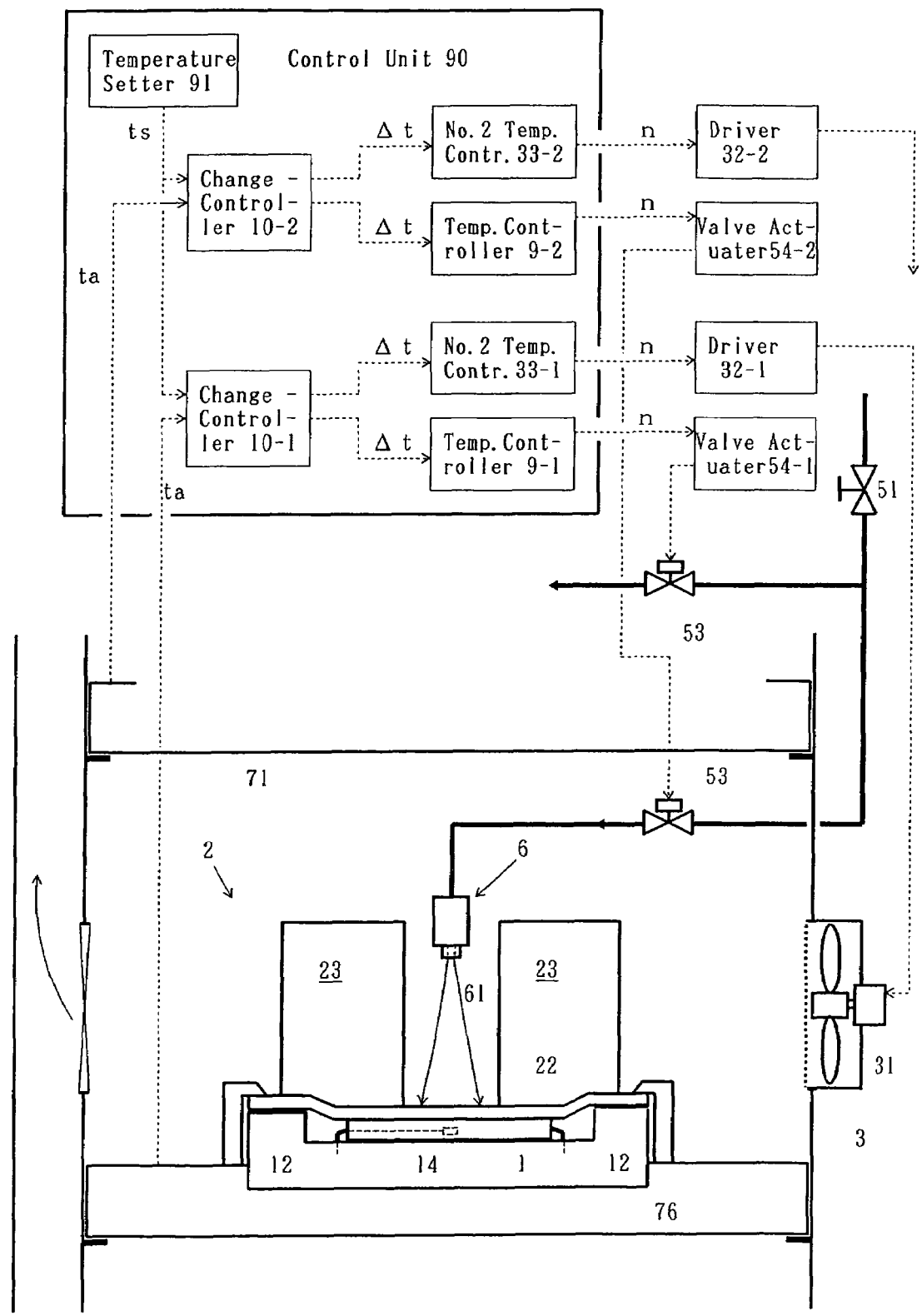
FIG. 7 is an explanatory drawing showing a configuration of the cooling apparatus including another control unit section.

FIG. 7 shows another configuration example relating to automation of the cooling apparatus.

In addition to the features of the cooling apparatus of FIG. 6, the apparatus of the present example comprises a motor 31 of the blower 3 serving in the present example as a supplied air flow rate adjustment means for adjusting the flow rate of air supplied from the blower 3 as the flow rate of air, a driver 32 for starting and stopping the motor at short periods measured in seconds, a second temperature controller 33 as a second control means for controlling the driver 32 so that when the difference $\Delta t$ between the temperature ta detected by the temperature sensor 14 and the set temperature ts becomes, for example, 5° C. or more, the $\Delta t$ becomes 5° C. as a prescribed value, and is provided separately therefrom in the present example a change controller 10 as a selection means for selecting either one of the temperature controller 9 or the second temperature controller 33, wherein when the $\Delta t$ becomes 5° C. or less, the temperature controller 9 performs a control identical to that shown in FIG. 6 to make ta equal to ts. The temperature controller 9 and temperature setter 91 as well as the change controller 10 and second temperature controller 33 are provided in the controller 90.

With this control, for example, when ta becomes 157° C. and $\Delta t$=7° C., where (ta−ts)=$\Delta t$, the change controller 10 transmits the $\Delta t$ to the second temperature controller 33, the controller 33 extends the operation time of the blower 3 to increase the amount of removed heat correspondingly to the $\Delta t$, conducts control so that the target $\Delta t$=5° C. is promptly reached, and transmits the $\Delta t$ this time to the temperature controller 9 after the target $\Delta t$ value has been reached. The temperature controller 9 increases the opening degree of the automatic valve 53 to increase the flow rate of compressed air correspondingly to the $\Delta t$ smaller than 5° C., and conducts control so that ta follows ts and the state with $\Delta t$=0°

C. is reached with good accuracy, while finely controlling the heat removal by increasing the amount of removed heat that is sufficiently smaller than the increase in the amount of heat removed by the supplied air.

On the other hand, when the difference between ta and ts, (ts−ta)=Δt, is 5° C. or more, for example, 7° C., the control is conducted to decrease the amount of heat removed by the supplied air correspondingly to this difference, that is, if (ta−ts)=−7° C., the control is conducted to obtain a large negative amount of the removed heat, that is, to reduce it greatly correspondingly to this difference, the difference of −5° C. is promptly reached, and if the difference approaches 0° C. from −5° C., then the amount of heat removed by the compressed air is similarly decreased correspondingly to this value, however, the degree of this decrease is sufficiently less than that in the case of the supplied air, and ta is brought to ts with good accuracy by this fine control.

Such a control is effective even when the burn-in test is started. Thus, as long as the temperature of the device 1 is low, ta is considerably smaller than ts, and Δt is large, the switch controller 10 selects the second temperature controller 33, the controller 33 performs control by providing a pulse to the driver 32 of the motor 31 of the blower 3 so as to shorten the operation time during certain start-stop periods and to increase the stop time sufficiently so as to decrease substantially the flow rate of the supplied air. In this case, the device 1 can be controlled to reach ts promptly and the test efficiency can be improved without delaying the increase in the temperature of the device 1 by unnecessarily overcooling the device.

FIG. 7 illustrates an example where the switch controller 10 is provided, but a configuration maybe also employed in which the function thereof is included in the temperature controller 9 and second temperature controller 33, and each is provided with a function that determines whether or not the inputted Δt falls within the respective control ranges, and the controlling action is conducted only by the controller for which Δt has fallen within the control range with a boundary of, for example, the aforementioned 5° C.

The present invention can be advantageously used in burn-in apparatuses, in particular, for those semiconductor devices that generate a large amount of heat.

The present invention may be embodied in other specific forms without departing from its spirit or essential characteristics. The described embodiments are to be considered in all respects only as illustrative and not as restrictive. The scope of the invention is, therefore, indicated by the appended claims and their combination in whole or in part rather than by the foregoing description. All changes that come within the meaning and range of equivalency of the claims are to be embraced within their scope.

We claim:

1. A cooling apparatus for cooling a semiconductor device to a target temperature;

said semiconductor device including a first surface, said first surface being planar, said semiconductor device passing electric current therethrough and generating heat so that a temperature thereof rises above said target temperature and a temperature of said first surface rises;

said apparatus comprising:

a cooling body comprising opposing first and second sides, said first side being a pressure-contact surface for pressing against said first surface and said second side being a cooled surface;

said cooled surface including inner and outer surfaces, said inner surface corresponding to a portion of certain range including a center of said first surface; and a plurality of cooling members vertically disposed on said outer surface so that air passes through said cooling members;

air supply means for supplying said air; and compressed air supply means for supplying by discharging compressed air with a sprayer, said compressed air being compressed by a compressor and cooled, so that said compressed air hits a portion of specific range including a position corresponding to said center.

2. The cooling apparatus of claim 1, comprising:

temperature detection means for detecting a temperature of said semiconductor device;

a compressed air flow rate adjustment means for adjusting a flow rate of said compressed air; and a control means for controlling said compressed air flow rate adjustment means so that said semiconductor device is cooled whereby said temperature detected by said temperature detection means becomes said target temperature.

3. The cooling apparatus of claim 2, comprising:

an air flow rate adjustment means for adjusting a flow rate of air; and a second control means for controlling said air flow rate adjustment means so that when a difference between said detected temperature and said target temperature is equal to or higher than a prescribed value, said semiconductor device is cooled whereby said difference becomes said prescribed value;

said control means controlling said compressed air flow rate adjustment means so that when said difference becomes less than said prescribed value, said semiconductor device is cooled whereby said temperature detected by said temperature detection means becomes said target temperature.

4. The cooling apparatus of claim 1, wherein said compressed air supply means mixes said compressed air and a heat transfer medium liquid so that said heat transfer medium liquid atomizes and is supplied by said compressed air.

* * * * *